United States Patent [19]
Jung

[11] Patent Number: 5,973,986
[45] Date of Patent: Oct. 26, 1999

[54] MEMORY DEVICE INCLUDING A COLUMN DECODER FOR DECODING FIVE COLUMNS

[75] Inventor: Chang Ho Jung, Fort Collins, Colo.

[73] Assignee: LSI Logic Corporation, Milpitas, Calif.

[21] Appl. No.: 09/019,264

[22] Filed: Feb. 5, 1998

[51] Int. Cl.$^6$ ................................................ G11C 8/00
[52] U.S. Cl. ........................ 365/230.06; 365/230.03
[58] Field of Search .......................... 365/230.03, 63, 365/189.08, 230.06, 230.08

[56] References Cited

U.S. PATENT DOCUMENTS

| | | | |
|---|---|---|---|
| 5,227,997 | 7/1993 | Kikuda et al. | 365/189.08 |
| 5,297,102 | 3/1994 | Tanizaki | 365/230.03 |
| 5,315,548 | 5/1994 | Ooishi et al. | 365/189.01 |
| 5,386,387 | 1/1995 | Tanizaki | 365/200 |
| 5,566,128 | 10/1996 | Magome | 365/230.06 |
| 5,610,865 | 3/1997 | Shin et al. | 365/200 |

OTHER PUBLICATIONS

Multi–Logic Level DRAM: A Differential Approach; Jeff Gilbert et al.; Worldwide Web.

*Primary Examiner*—Son Mai

[57] ABSTRACT

A memory device including a plurality of memory cells, a plurality of bit lines, a plurality of bit line sense amplifiers, a plurality of column port gates, and a column decoder connected to a multiple of five column port gates. Each of the bit line sense amplifiers is connected to at least one of the bit lines and to at least one of the memory cells. Each of the column port gates is connected to at least one of the bit line sense amplifiers. The column decoder provides signals to the column port gates to which it is connected to select corresponding bit lines connected to the column port gates.

22 Claims, 2 Drawing Sheets

MEMORY DEVICE INCLUDING A COLUMN DECODER FOR DECODING FIVE COLUMNS

The present invention relates generally to semiconductor memory devices, and more specifically relates to a semiconductor memory device which utilizes a column decoder to decode five columns thereby providing for parity bit organization.

BACKGROUND OF THE INVENTION

A typical semiconductor memory device includes a plurality of memory cells arranged in arrays, and a memory cell selector means for enabling the selection of a particular memory cell to facilitate the reading of data from, or the writing of data to, that particular memory cell.

For example, a high density dynamic random access memory (DRAM) includes a plurality of core cell blocks, and each core cell block contains several memory cells. The memory cells are metal-oxide semiconductor field-effect transistors (MOSFETs), and each MOSFET acts as a switch. To this end, each pair of MOSFETs is connected to a pair of bit lines (an input/output or I/O port), and the capacitance of each MOSFET can be charged by data.

A bit line sense amplifier is provided in communication with each I/O port corresponding to each pair of memory cells. Each bit line sense amplifier amplifies the data which is read from, or the data which is transferred to, the corresponding MOSFET or memory cell through the bit line pair or I/O port.

To select a memory cell, a memory column address is provided to the DRAM from outside the DRAM. A column decoder decodes this column address which is received from outside the DRAM, and then provides a signal to the corresponding bit line sense amplifier to select the proper bit line of the bit line pair or I/O port therefore selecting the corresponding memory cell which corresponds thereto.

A typical DRAM provides that each column decoder decodes four columns, two columns from each side of a core cell block, where each column contains one bit line sense amplifier corresponding to one I/O port (bit line pair). An input/output bus line, which is an input/output data line that sends data to a write (data-in) buffer, is driven by four column decoders. Therefore, the bus line of a typical DRAM is sixteen columns wide.

In many situations, data bit organizations are not extremely wide. Therefore, each column decoder will produce four columns of data, and the above-described DRAM structure, where each column decoder decodes four columns and each bus line is sixteen columns wide, is effective and acceptable.

In contrast, in many other situations, such as where the DRAM is embedded on an ASIC chip with other memory structures, the data bit organization is much wider. As a result, the above-described conventional DRAM bit line structure, where each column decoder decodes four columns, provides much disadvantage. Therefore, within many embedded DRAM applications, an input/output scheme similar to that of an SRAM is utilized.

Such a DRAM structure provides that several core cell blocks are placed in parallel. Of course, the number of rows within each core cell block will depend upon the memory size to be provided. Each column port has two gates, and while one gate corresponds to a column decoder, the other gate corresponds to an "n_sen" signal produced from nsg (N sense gate signal)—a delayed gating signal produced by a corresponding bit line sense amplifier.

This DRAM structure is acceptable for some embedded DRAM applications. However, some embedded DRAM applications, as DRAM users and system engineers generally are aware, must utilize a parity bit. This DRAM structure does not generally provide for the implementation of a parity bit without having to utilize an extra column decoder. For example, it is not easy to provide parity bit organizations such as 'x9', 'x17', 'x18', 'x34', 'x36', 'x68', 'x72', 'x136', 'x144', and so on, in a tight column pitch within a DRAM which only utilizes column decoders which decode four columns. The extra column for the parity bit requires that the next column decoder be used.

OBJECTS AND SUMMARY

It is an object of the present invention to provide a memory device which includes a column decoder which decodes five columns.

It is a further object of the present invention to provide a memory device which is ideal for wide data bit organizations.

It is a further object of the present invention to provide a memory device which provides parity bit organizations in a tight column pitch.

It is a further object of the present invention to provide a memory device which provides parity bit organization implementation using conventional column decoder control.

In accordance with these and other objects, the present invention provides a memory device which includes a column decoder connected to a multiple of five column port gates. The memory device includes a plurality of memory cells, a plurality of bit lines, a plurality of bit line sense amplifiers, and a plurality of column port gates. Each of the bit line sense amplifiers is connected to at least one of the bit lines and to at least one of the memory cells. Each of the column port gates is connected to at least one of the bit line sense amplifiers. The column decoder which is connected to the multiple of five column port gates provides signals to the column port gates to select corresponding bit lines connected thereto.

Desirably, the memory device is a dynamic random access memory (DRAM), and the memory cells are arranged in core cell blocks. The DRAM includes a plurality of column decoders, with four column decoders being associated with each core cell block. Each of the column decoders is connected to three column port gates adjacent one side of the core cell block and is connected to two column port gates adjacent another side of the core cell block. With respect to each core cell block, there are twenty column port gates connected to the four column decoders, and each of the column port gates is connected to at least one of the pairs of bit lines. The column decoders provide signals to the twenty column port gates to select corresponding pairs of bit lines connected thereto. The DRAM also preferably includes a pair of input/output lines connected to each column port gate and the input/output lines are connected to an input/output bus line which has a twenty column pitch.

Another aspect of the present invention provides a method of selecting at least one bit line from a plurality of bit lines within a memory device. The method includes providing the memory device, where the memory device includes a plurality of memory cells, a plurality of bit lines, a plurality of bit line sense amplifiers, a plurality of column port gates, and a column decoder. Each of the bit line sense amplifiers is connected to at least one of the bit lines and to at least one of the memory cells. Also, each of the column port gates is connected to at least one of the bit line sense amplifiers. The column decoder is connected to a multiple of five column port gates. Within the method, a column address is provided to the column decoder, and the column decoder decodes the column address and provides a signal to at least one of the column port gates to which the column decoder is connected to select at least one corresponding bit line connected thereto.

Desirably, the memory device provided within the method is a dynamic random access memory (DRAM), and the memory cells are arranged in core cell blocks. The DRAM includes a plurality of column decoders, with four column decoders being associated with each core cell block. Each of the column decoders is connected to three column port gates adjacent one side of the core cell block and is connected to two column port gates adjacent another side of the core cell block. With respect to each core cell block, there are twenty column port gates connected to the four column decoders, and each of the column port gates is connected to at least one of the pairs of bit lines. The column decoders provide signals to the twenty column port gates to select corresponding pairs of bit lines connected thereto. The DRAM also preferably includes an input/output bus line which is connected to the bit line sense amplifiers and which has a twenty column pitch.

By providing that a column decoder decodes five columns instead of four, an embodiment of the present invention may provide a DRAM which is more ideal for wide data bit organizations, such as an embedded DRAM which provides parity bit organizations in a tight column pitch using conventional column decoder control.

BRIEF DESCRIPTION OF THE DRAWINGS

The present invention and the advantages thereof will become more apparent upon consideration of the following detailed description when taken in conjunction with the accompanying drawings of which.

DETAILED DESCRIPTION OF AN EMBODIMENT OF THE INVENTION

While the present invention may be embodied in the form of many different types of memory devices, the present invention is preferably provided in the form of a dynamic random access memory (DRAM).

Figure 1:
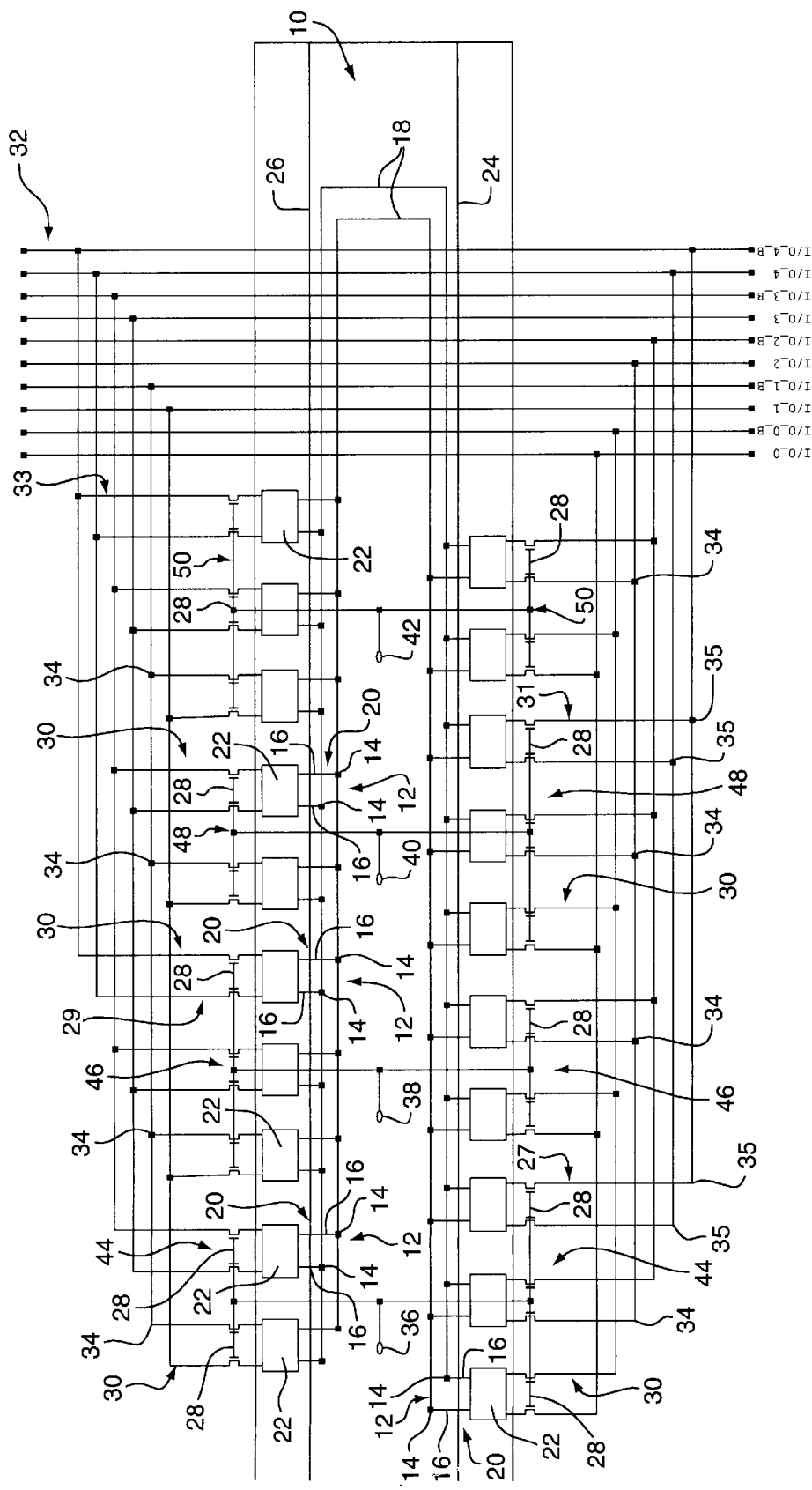
FIG. 1 is a schematic diagram of a portion of a memory device in accordance with the present invention illustrating a single core cell block and the input/output column paths thereof.
Figure 2:
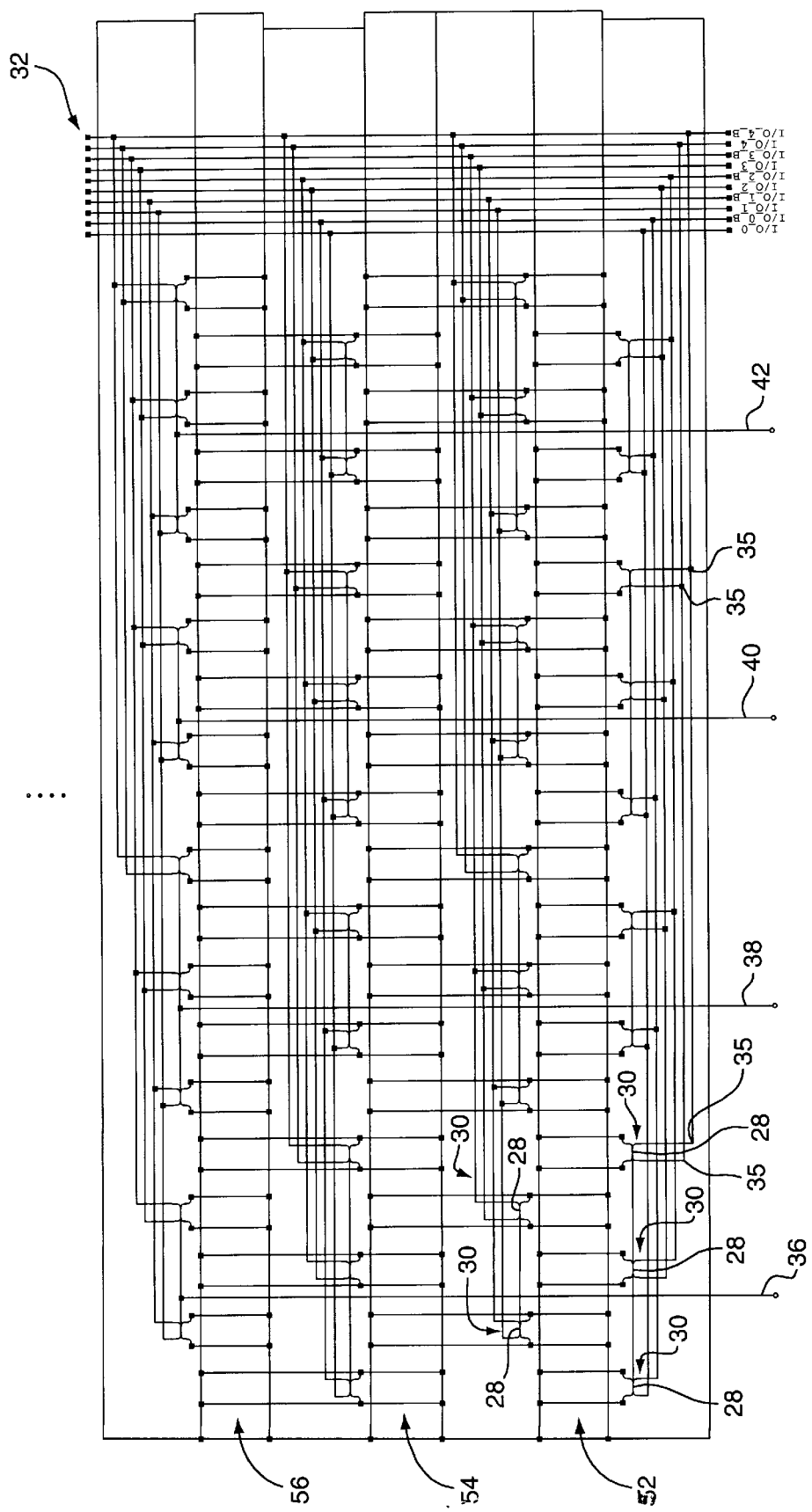
FIG. 2 is schematic diagram similar to FIG. 1, but which illustrates a plurality of core ell blocks of the memory device in accordance with the present invention and the input/output column paths thereof.

FIGS. 1 and 2 illustrate portions of a DRAM in accordance with the present invention. The DRAM includes column decoders which decode five columns. By providing that the column decoders decode five columns instead of four, the DRAM is more ideal for wide bit organizations and can implement a parity bit within a tight column pitch using conventional column decoder control. While the DRAM includes several core cell blocks, for clarity FIG. 1 depicts only a single core cell block of the DRAM and the input/output column paths of the single core cell block. In contrast, FIG. 2 depicts a plurality of core cell blocks (but not all of the core cell blocks) of the DRAM and the input/output column paths of the plurality of core cell blocks depicted. That which is illustrated in FIG. 1 will now be discussed.

FIG. 1 illustrates a single core cell block 10, and the core cell block 10 includes a plurality of pairs 12 of memory cells 14. More specifically, the core cell block 10 preferably includes twenty pairs 12 of memory cells 14. Each memory cell 14 is defined by the intersection of a bit line 16 with a word line 18. Therefore, a pair 20 of bit lines 16 is associated with each pair 12 of memory cells 14 in the core cell block 10, and there are twenty pairs 20 of bit lines 16 and a pair of word lines 18 associated with the core cell block 10.

Each pair 20 and 12 of bit lines 16 and memory cells 14, respectively, is connected to a bit line sense amplifier structure 22. Each bit line sense amplifier structure 22 amplifies data read from a memory cell 14 to a bit line 16 or data transmitted to the bit line 16 from outside the memory cell 14. As mentioned, there are twenty pairs 20 of bit lines 16 associated with the core cell block 10. Therefore, there are preferably twenty bit line sense amplifier structures 22 associated with the core cell block 10 with each pair 20 of bit lines 16 sharing a bit line sense amplifier structure 22. Preferably, as shown, there are ten bit line sense amplifier structures 22 located adjacent one side 24 of the core cell block 10, and there are ten bit line sense amplifier structures 22 located adjacent the other side 26 of the core cell block 10. Each bit line sense amplifier structure 22 includes an upper bit line selector, a bit line sense amplifier, a bit line equalizer and a lower bit line selector. One having ordinary skill in the art would recognize the structure and operation of such a bit line sense amplifier structure 22.

A transfer gate or column port gate 28 is connected to each bit line sense amplifier 22 and corresponding pair 20 and 12 of bit lines 16 and memory cells 14. Therefore, there are twenty column port gates 28 associated with the core cell block 10. Ten column port gates 28 are located at the one side 24 of the core cell block 10 and ten column port gates 28 are located at the other side 26 of the core cell block 10.

Each column port gate 28 is connected to an input/output data line pair 30, and each input/output data line pair 30 is connected to an input/output bus line 32. The input/output bus line 32 preferably has a twenty column relaxed metal pitch and leads to a data sense amplifier of a write data in buffer. As shown, each of the data lines of sixteen of the twenty input/output data lines pairs 30 has four contacts 34, while the data lines of the remaining four 27, 29, 31, 33 input/output data line pairs 30 has only two contacts 35. This provides that parity bit organization can be implemented using conventional column decoder control.

As mentioned, there are twenty column port gates 28 associated with the core cell block 10: ten column port gates 28 on one side 24 of the core cell block 10, and ten column port gates 28 on the other side 26 of the core cell block 10. A quantity of four column decoders 36, 38, 40, 42 are connected to the twenty column port gates 28, one column decoder is connected to each set 44, 46, 48, 50 of five column port gates 28. Each column decoder 36, 38, 40, 42 is connected to three column port gates 28 on one side of the core cell block and to two column port gates 28 on the other side of the core cell block. Each column decoder 36, 38, 40, 42 provides signals to the set 44, 46, 48, 50 of column port gates 28 connected thereto in order to select corresponding bit lines 16 connected to that set 44, 46, 48, 50 of column port gates 28.

As shown, preferably the arrangement of connections of column decoders 36, 38, 40, 42 to sets 44, 46, 48, 50 of column port gates 28 linearly alternates with respect to the core cell block 10. For example, as illustrated in FIG. 1, a first column decoder 36 which is connected to a first set 44 of column port gates 28 is connected to three column port gates 28 on the first side 24 of the core cell block 10 and to two column port gates 28 on the second side 26 of the core cell block 10. In contrast, a second column decoder 38, which is connected to a second set 46 of column port gates 28 adjacent the first set 44 of column port gates 28, is connected to two column port gates 28 on the first side 24 of the core cell block 10 and to three column port gates 28 on the second side 26 of the core cell block 10.

By providing that the column decoders 36, 38, 40, 42 decode five columns, wider bit organizations can be implemented. Additionally, a parity bit can be implemented within a relatively tight column pitch using conventional column decoder control. This is because the fifth bit line pair 20 of each set of column port gates 28 has two contacts instead of four.

For example, to provide 'x9' bit organization, five columns or column port gates 28 from the first set 44 of column port gates 28 can be used, and four columns or column port gates 28 from the second set 46 of column port gates 28 can be used (5+4=9). Likewise, to provide 'x17' bit organization, four columns or column port gates 28 from a first three sets 44, 46 and 48 of column port gates 28 can be used, and five columns or column port gates 28 from a fourth set 50 of column port gates can be used (4+4+4+5=17). In much the same manner, other parity bits organizations such as 'x18', 'x34', 'x36', 'x68', 'x72', 'x136', 'x144' and so on can readily be implemented without having to use an extra column decoder.

As mentioned, FIG. 2 depicts a plurality of core cell blocks of the DRAM and the input/output column paths of the plurality of core cell blocks. Because much of what is illustrated in FIG. 2 is identical to that which is illustrated in FIG. 1, identical reference numerals are used to identify identical parts, and description thereof is usually omitted with the understanding that one may review the description of that which is depicted in FIG. 1 to obtain an understanding of that which is depicted in FIG. 2. Although there are bit line sense amplifiers associated with each column port gate 28, the bit line sense amplifiers are omitted from FIG. 2 for clarity. While FIG. 2 does not specifically identify the bit line sense amplifiers, FIG. 2 does specifically identify the column decoders 36, 38, 40, 42 and column port gates 28 of the multiple core cell block configuration. By viewing FIG. 2 in connection with FIG. 1, one having ordinary skill in the art would readily recognize the complete detailed structure of the overall structure and connections between the plurality of core cell blocks.

As shown in FIG. 2, each column decoder 36, 38, 40 and 42 is connected to column port gates 28 associated with a plurality of core cell blocks 52, 54, 56. More specifically, each column decoder 36, 38, 40, 42 is connected to a multiple of five column port gates 28. This provides that each column decoder 36, 38, 40, 42 may implement a parity bit in association with a plurality of core cell blocks in much the same manner as was described with relation to that which is depicted in FIG. 1. Additionally, because each data line of the input/output data line pair 30 associated with the fifth column port gate 28 only has two contacts 35, parity bit organization can be implemented using conventional column decoder control.

While a preferred embodiment of the present invention is shown and described, it is envisioned that those skilled in the art may devise various modifications of the present invention without departing from the spirit and scope of the appended claims. For example, it is envisioned that not all of the column decoders provided in the DRAM may be configured for decoding five columns, and that one or more of the column decoders included in the DRAM may decode only four columns.

What is claimed is:

1. A memory device comprising: a plurality of memory cells; a plurality of bit lines; a plurality of bit line sense amplifiers, each of said bit line sense amplifiers connected to at least one of said bit lines and to at least one of said memory cells; a plurality of column port gates, each of said column port gates connected to at least one of said bit line sense amplifiers; and a column decoder connected to a multiple of five column port gates, said column decoder providing signals to said column port gates connected thereto to select corresponding bit lines connected to said column port gates.

2. The memory device of claim 1, said memory device comprising a dynamic random access memory.

3. The memory device of claim 1, said bit line sense amplifiers amplifying data read from said at least one of said bit lines connected thereto.

4. The memory device of claim 1, wherein said memory cells are arranged in core cell blocks having a first side and a second side, wherein said memory device comprises a plurality of column decoders, wherein four column decoders are associated with each core cell block, wherein each of said four column decoders is connected to three column port gates adjacent said first side of said core cell block and is connected to two column port gates adjacent said second side of said core cell block.

5. The memory device of claim 1, wherein said memory cells are arranged in one or more core cell blocks having a first side and a second side, said column decoder connected to three column port gates adjacent said first side of said core cell block and to two column port gates adjacent said second side of said core cell block.

6. The memory device of claim 5, further comprising at least one pair of input/output lines connected to each of said column port gates, said input/output lines connected to an input/output bus line.

7. The memory device of claim 6, wherein said memory device comprises at least twenty column port gates connected to said four column decoders, each of said twenty column port gates connected to at least one of said bit lines, said column decoders providing signals to said twenty column port gates to select corresponding bit lines connected to said twenty column port gates.

8. The memory device of claim 7, wherein said input/output bus line has a twenty column pitch.

9. A memory device comprising: twenty pairs of memory cells arranged in a core cell block having a first side and a second side; a pair of bit lines connected to each pair of said memory cells; a bit line sense amplifier connected to each pair of said bit lines; a column port gate connected to each of said bit line sense amplifiers; and column decoders, each of said column decoders connected to five column port gates, said column decoders providing signals to said five column port gates connected thereto to select corresponding pairs of bit lines connected to said column port gates.

10. The memory device of claim 9, wherein ten column port gates are arranged adjacent each of said first and second sides of said core cell block.

11. The memory device of claim 10, wherein each column decoder is connected to three column port gates adjacent one of said first and said second sides of said core cell block and to two column port gates adjacent the other of said first and said second sides of said core cell block.

12. The memory device of claim 11, wherein said column port gates are connected to a bus line, said bus line having a twenty column pitch.

13. A dynamic random access memory device comprising a column decoder and a plurality of bit line pairs connected to the column decoder, wherein said column decoder provides a signal for selecting bit line pairs of a multiple of five bit line pairs.

14. The dynamic random access memory device of claim 13, further comprising a plurality of column port gates and one or more core cell blocks having a first side and a second side, wherein said column decoder is connected to three column port gates adjacent said first side of said core cell block and is connected to two column port gates adjacent said second side of said core cell block .

15. A method of selecting at least one bit line from a plurality of bit lines within a memory device, said method comprising:

providing said memory device, said memory device comprising a plurality of memory cells, a plurality of bit lines, a plurality of bit line sense amplifiers, a plurality of column port gates, and a column decoder, wherein each of said bit line sense amplifiers is connected to at least one of said bit lines and to at least one of said memory cells, wherein each of said column port gates is connected to at least one of said bit line sense amplifiers, wherein said column decoder is connected to a multiple of five column port gates; and providing a column address to said column decoder, said column decoder decoding said column address and providing a signal to at least one of said column port gates to select at least one corresponding bit line connected to said at least one column port gate.

16. The method of claim 15, wherein said column decoder implements a parity bit.

17. The method of claim 15, wherein said memory device comprises a dynamic random access memory.

18. The method of claim 15, wherein said memory cells of said memory device are arranged in core cell blocks having a first side and a second side, wherein said memory device includes a plurality of column decoders, wherein four column decoders are associated with each core cell block, wherein each of said four column decoders is connected to three column port gates adjacent said first side of said core cell block and is connected to two column port gates adjacent said second side of said core cell block.

19. The method of claim 15, wherein said memory cells are arranged in one or more core cell blocks having a first side and a second side, and wherein said column decoder is connected to three column port gates adjacent said first side of said core cell block and to two column port gates adjacent said second side of said core cell block.

20. The method of claim 19, wherein said memory device further comprises an input/output bus line connected to at least some of said bit line sense amplifiers, said input/output bus line comprising at least five input/output lines.

21. The method of claim 20, wherein said memory device comprises at least twenty column port gates connected to said four column decoders, each of said twenty column port gates connected to at least one of said pairs of bit lines, said method further comprising providing column addresses to said column decoders, said column decoders decoding said column addresses and providing signals to said twenty column port gates to select corresponding pairs of said bit lines connected to said twenty column port gates.

22. The method of claim 21, wherein said memory device further comprises an input/output bus line connected to at least some of said bit line sense amplifiers, said input/output bus line having a twenty column pitch.

\* \* \* \* \*